(12) United States Patent
Dargis et al.

(10) Patent No.: US 9,460,917 B2
(45) Date of Patent: Oct. 4, 2016

(54) METHOD OF GROWING III-N SEMICONDUCTOR LAYER ON SI SUBSTRATE

(71) Applicants: Rytis Dargis, Fremont, CA (US);
Andrew Clark, Los Altos, CA (US);
Nam Pham, Palo Alto, CA (US);
Erdem Arkun, Campbell, CA (US)

(72) Inventors: Rytis Dargis, Fremont, CA (US);
Andrew Clark, Los Altos, CA (US);
Nam Pham, Palo Alto, CA (US);
Erdem Arkun, Campbell, CA (US)

(73) Assignee: Translucent, Inc., Palo Alto, CA (US)

( * ) Notice: Subject to any disclaimer, the term of this patent is extended or adjusted under 35 U.S.C. 154(b) by 115 days.

(21) Appl. No.: 14/179,040

(22) Filed: Feb. 12, 2014

(65) Prior Publication Data

US 2015/0228484 A1    Aug. 13, 2015

(51) Int. Cl.
*H01L 21/20*    (2006.01)
*H01L 21/36*    (2006.01)
*H01L 21/02*    (2006.01)

(52) U.S. Cl.
CPC ..... *H01L 21/02502* (2013.01); *H01L 21/0254* (2013.01); *H01L 21/02381* (2013.01); *H01L 21/02433* (2013.01); *H01L 21/02483* (2013.01); *H01L 21/02488* (2013.01); *H01L 21/02658* (2013.01)

(58) Field of Classification Search
CPC .................. H01L 21/02381; H01L 21/02433; H01L 21/02488; H01L 21/02502; H01L 21/0254
See application file for complete search history.

(56) References Cited

U.S. PATENT DOCUMENTS

2012/0104443 A1*    5/2012    Clark .................. H01L 29/7842
257/98

* cited by examiner

*Primary Examiner* — Hoai V Pham
(74) *Attorney, Agent, or Firm* — Robert A. Parsons; Michael W. Goltry; Parsons & Goltry

(57) ABSTRACT

A method of growing III-N semiconducting material on a silicon substrate including the steps of growing a layer of epitaxial rare earth oxide on a single crystal silicon substrate and modifying the surface of the layer of epitaxial rare earth oxide with nitrogen plasma. The method further includes the steps of growing a layer of low temperature epitaxial gallium nitride on the modified surface of the layer of epitaxial rare earth oxide and growing a layer of bulk epitaxial III-N semiconductive material on the layer of low temperature epitaxial gallium nitride.

15 Claims, 4 Drawing Sheets

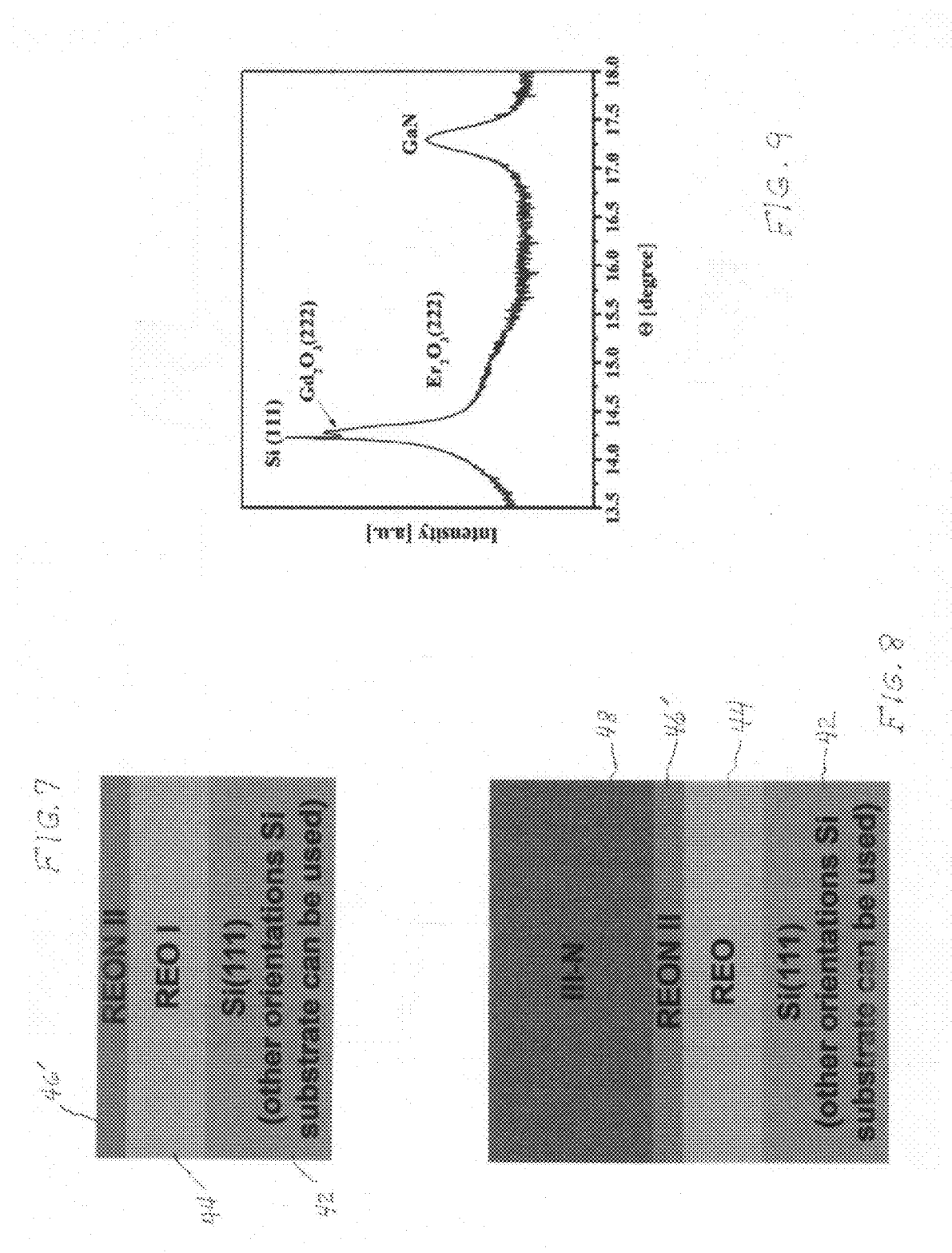

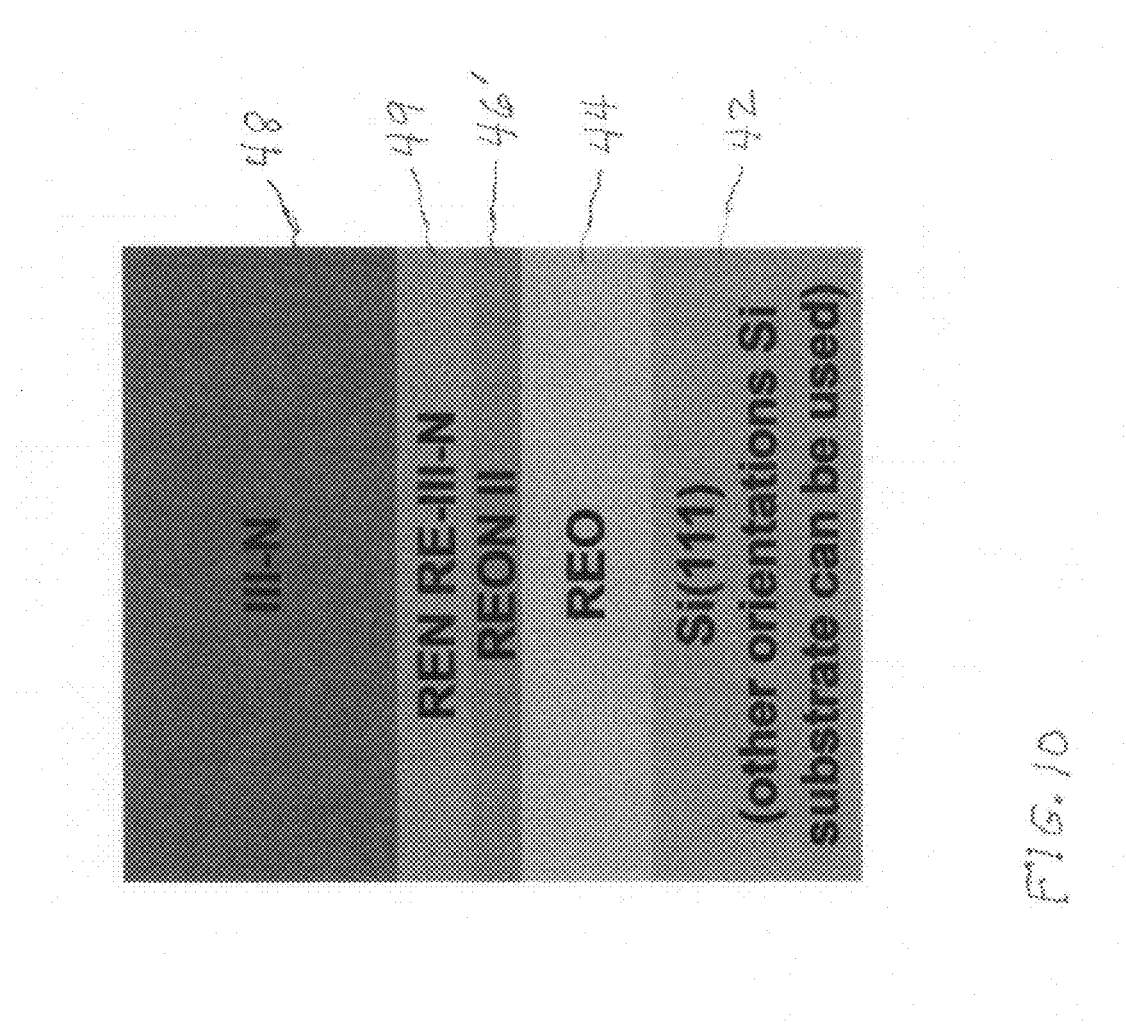

METHOD OF GROWING III-N SEMICONDUCTOR LAYER ON SI SUBSTRATE

FIELD OF THE INVENTION

This invention relates in general to the growth of semiconductor layers of III-N material on a silicon substrate and more specifically to III-N epitaxial growth on a modified REO buffer on a silicon substrate.

BACKGROUND OF THE INVENTION

GaN or other III-N semiconductor based electronics and optoelectronics need low cost and scalable substrates. GaN or other III-N semiconductors grown on a silicon substrate is generally considered to be the most cost efficient technology. However, it is known that growing a III-N material, such as GaN, on a silicon substrate is difficult due in large part to the large crystal lattice mismatch (−16.9%) and the huge difference in thermal expansion coefficients (56%) between silicon and GaN. Also, final tinsel stress arises during III-N growth on Silicon and subsequent cooling of the structure. Thus, some type of buffer layer or layers is generally formed on the silicon substrate and the III-N material is grown on the buffer layer.

Generally, the prior art buffer layers, such as an AlN buffer, do not adequately reduce the strain in the silicon substrate or the III-N due to crystal lattice mismatch. In the prior art, various attempts are disclosed for the growth of different devices including III-V materials on silicon and other substrates. In some copending United States patent applications rare earth nitrides and rare earth oxy-nitrides are used in buffer layers, all of which are at least partially successful. Some specific applications and patents include: (A31) entitled "Rare Earth Oxy-Nitride Buffered III-N On Silicon", Ser. No. 13/196,919, filed on Aug. 3, 2011; (A41) entitled "Nucleation of III-N On REO Templates", Ser. No. 13/845,426, filed on Mar. 18, 2013; (A62) entitled "Modification Of REO By Subsequent III-N EPI Process", U.S. Pat. No. 8,501,635, issued Aug. 6, 2013; (A65) entitled "III-N Material Grown On REN Epitaxial Buffer On Si Substrate", Ser. No. 13/939,721, filed on Jul. 11, 2013; and (A67) entitled "REN Semiconductor Layer Epitaxially Grown on REAlN/REO Buffer on Si Substrate", Ser. No. 14/161,925, filed on Jan. 23, 2014, and all incorporated herein by reference.

It would be highly advantageous, therefore, to remedy the foregoing and other deficiencies inherent in the prior art and copending applications.

Accordingly, it is an object of the present invention to provide new and improved methods for the growth of single crystal III-N semiconductor material on a silicon substrate.

It is another object of the present invention to provide new and improved methods for the growth of single crystal III-N semiconductor material on a silicon substrate using an improved template.

It is another object of the present invention to provide new and improved methods for the formation of a nucleation layer for the growth of single crystal III-N semiconductor material.

SUMMARY OF THE INVENTION

The desired objects and aspects of the instant invention are achieved in accordance with a preferred method of growing III-N semiconducting material on a silicon substrate including the steps of growing a layer of epitaxial rare earth oxide on a single crystal silicon substrate and modifying the surface of the layer of epitaxial rare earth oxide with nitrogen plasma. The method further includes the steps of growing a layer of low temperature epitaxial gallium nitride on the modified surface of the layer of epitaxial rare earth oxide and growing a layer of bulk epitaxial III-N semiconductive material on the layer of low temperature epitaxial gallium nitride.

The desired objects and aspects of the instant invention are further realized in accordance with a specific embodiment of III-N semiconducting material on a silicon substrate including a single crystal layer of rare earth oxide positioned on a single crystal silicon substrate and the surface of the single crystal layer of rare earth oxide is terminated with nitrogen atoms forming a nitrogen atom template. A single crystal layer of low temperature GaN is positioned on the nitrogen atom template and a single crystal epitaxial bulk semiconductor III-N layer is positioned on the single crystal layer of low temperature GaN.

The desired objects and aspects of the instant invention are further realized in accordance with a specific method of growing III-N semiconducting material on a silicon substrate including epitaxially growing a first layer of rare earth oxide on the silicon substrate, the first layer of rare earth oxide being substantially lattice matched to the silicon substrate. Epitaxially growing a second layer of rare earth oxide on the first layer of rare earth oxide, the second layer of rare earth oxide having a different lattice constant then the first layer of rare earth oxide creating a stress in the second layer of rare earth oxide. Nitridizing the second layer of epitaxial rare earth oxide with nitrogen plasma to form a nucleation layer and epitaxially growing a layer of III-N material on the nucleation layer of epitaxial rare earth oxide.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 7 is a simplified layer diagram illustrating the nitridizing of the REO II layer of FIG. 4;

FIG. 8 is a simplified layer diagram of additional steps in the method and illustrated in FIG. 6;

FIG. 9 illustrates an XRD scan of the structure illustrated in FIG. 8; and

FIG. 10 is a simplified layer diagram of a modification to the structure illustrated in FIG. 8, in accordance with the present invention.

DETAILED DESCRIPTION OF THE DRAWINGS

Figure 1:
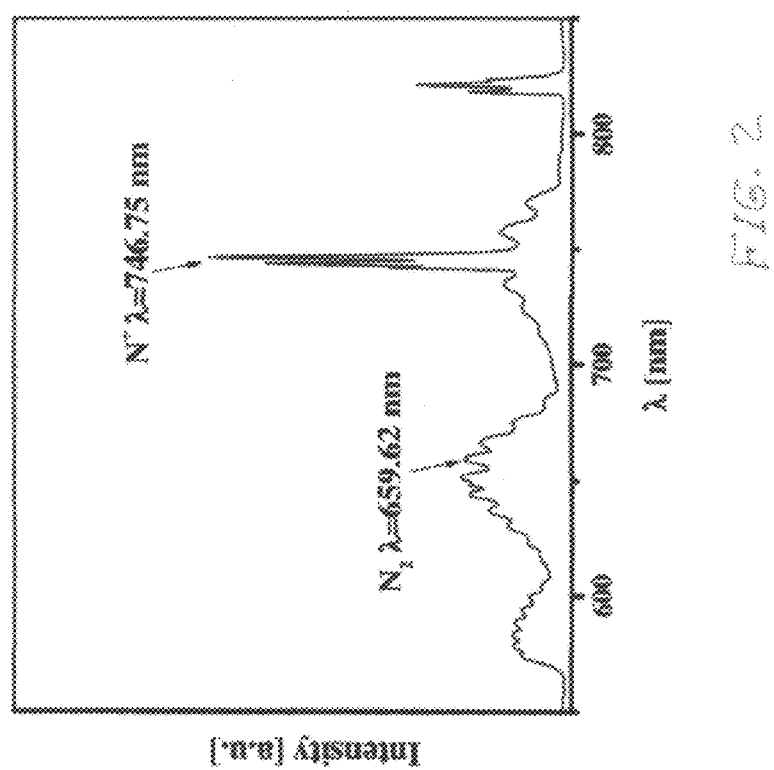
FIG. 1 is a simplified layer diagram illustrating a method and structure of growing single crystal III-N material on a silicon substrate with the new template, in accordance with the present invention.

Turning to FIG. 1, a simplified layer diagram is illustrated of a structure 10 representing apparatus and several steps in a process of growing single crystal III-N material on a silicon substrate 12, in accordance with the present invention. It will be understood that substrate 12 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates, it will be understood, are not limited to any specific crystal orientation but could include (111) silicon, (110) silicon, (100) silicon, offcuts thereof, or any other orientation or variation known and used in the art. However, throughout this disclosure substrate 12 is illustrated with a preferred (111) orientation because of the simplification of further operations.

Figure 3:
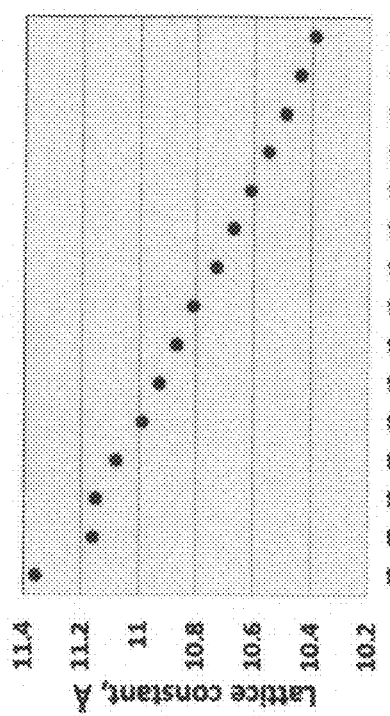
FIG. 3 is a chart illustrating the lattice constant (crystal spacing) of the lanthanide oxides (rare earth oxides)

In the present invention, as illustrated in FIG. 1, a buffer 14 of single crystal rare earth oxide (REO) is epitaxially grown on silicon substrate 12. Buffer 14 can include a single layer of REO substantially crystal lattice matched to silicon substrate 12 or multiple layers engineered to more closely mate silicon substrate 12 to a III-N semiconductor material. For example, at least a lower portion of buffer 14 can include a single crystal cubic REO material, such as $Er_2O_3$, with upper portions gradually or in a step function changing to hexagonal REO. For example, as illustrated in the chart of FIG. 3, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. In this example the lattice mismatch between $Er_2O_3$ and silicon is approximately −2%, herein referred to as "substantially" crystal lattice matched.

Figure 2:
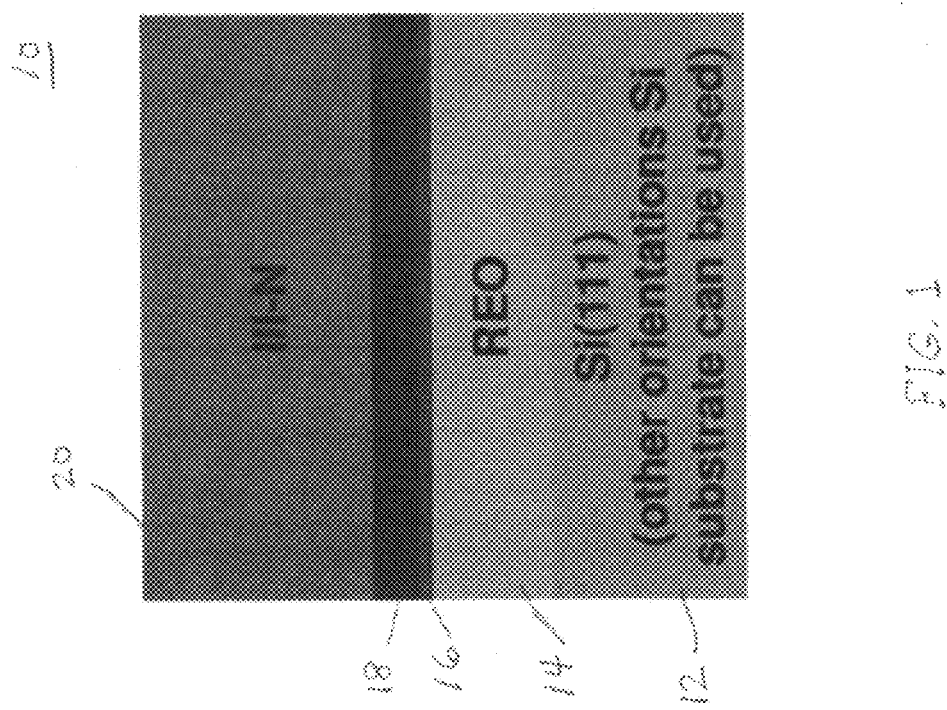
FIG. 2 illustrates characteristic emission wavelengths of optical emission spectra of nitrogen plasma.

A nucleation layer or template 16 for the growth of III-N semiconductor material is formed by modifying the surface of REO buffer 14 with nitrogen plasma. The nitrogen plasma modifies the surface of REO buffer 14 by terminating the REO surface with nitrogen atoms (i.e. nitrogen atoms attaching to loose bonds) to form template 16 for the growth of III-N material thereon. In a preferred embodiment, the nitrogen plasma has an atomic-to-molecular ratio in a range of 2 to 4 and the substrate temperature during the nitrogen plasma modification is in a range of 550° C. to 850° C. The atomic-to-molecular ratio is determined, in this specific method, from characteristic emission wavelengths of optical emission spectra of the nitrogen plasma, as illustrated, for example, in FIG. 2. Once the nitrogen plasma modification is completed, a thin layer 18 of low temperature GaN is epitaxially grown on template 16. Layer 18 of low temperature GaN in this preferred embodiment is grown using the following parameters: a substrate temperature in a range of 450° C. to 650° C. (defined as "low temperature"); atomic-to-molecular nitrogen ratio in the plasma in a range of 2 to 4; and gallium vapor partial pressure of approximately $1 \times 10^{-6}$ Torr. Layer 18 of low temperature GaN helps in the later epitaxial growth of bulk III-N material at higher temperature.

With thin layer 18 of low temperature GaN completed a layer 20 of bulk III-N semiconductor material is epitaxially grown on layer 18. In this preferred embodiment and using GaN as an example of the III-N material, layer 18 is epitaxially grown using the following parameters: a substrate temperature in a range of 800° C. to 950° C.; a gallium partial pressure of approximately $2.5 \times 10^{-6}$ Torr; and an atomic-to-molecular nitrogen ratio in the plasma in a range of 2 to 4.

Because of the crystal matching of template 16 and layer 18 of low temperature GaN, layer 20 of bulk III-N semiconducting material can be epitaxially grown relatively thick with very low or no fractures or stress. Thus, structure 10 can be used for the growth of III-N (e.g. GaN, AlN) semiconductor layers used in, for example, photonic devices. As an example, a III-N LED structure (not shown) could be formed in/on layer 20. Layer 20 is illustrated as a single layer for convenience but it should be understood that the III-N LED structure could include the growth of one or more typical layers, including for example, i-GaN, n-GaN, active layers such as InGaN/GaN, electron blocking layers, p-GaN, and other inter-layers used in the formation and performance of LED (especially photonic LED) devices.

Thus, in the present novel process, buffer 14 including one or more layers of single crystal REO is first epitaxially grown on silicon substrate 12. Nitrogen plasma is used to modify the surface of REO buffer 14 by terminating the REO surface with nitrogen atoms to form template 16 for the growth of III-N material. A thin layer 18 of low temperature GaN is epitaxially grown on template 16 and layer 20 of bulk III-N material is grown epitaxially on layer 18. Layer 20 may be an active semiconductor layer for the formation of various semiconductor devices or additional layers may be epitaxially grown on layer 20. Also, because of the reduced stress, layer 20 can be grown sufficiently thick to form electronic of photonic devices therein.

Figure 4:
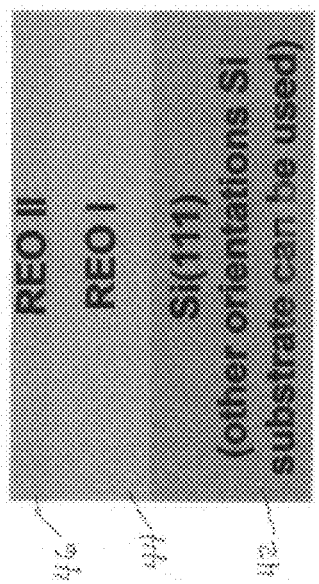
FIG. 4 is a simplified layer diagram of first steps in another method and structure of growing single crystal III-N material on a silicon substrate, in accordance with the present invention.

Turning now to FIG. 4, a simplified layer diagram is illustrated of first steps in another method and structure of growing single crystal III-N material on a silicon substrate, in accordance with the present invention. During the modification of the REO surface with N-plasma, metal bonds are broken and oxygen is replaced with nitrogen atoms. Generally, oxygen-metal ionic bonds are strong and for this reason the nitridation process requires substantial processing time. It has been found that the oxygen-metal ionic bonds can be weakened by introducing stress into the REO layer.

As an example of introducing stress into the REO layer, the gadolinium oxide lattice constant is larger than the lattice constant of erbium oxide, as illustrated in the chart of FIG. 3. Erbium oxide ($Er_2O_3$) grown on gadolinium oxide ($Gd_2O_3$) is under tensile stress before it relaxes after reaching critical thickness. The critical thickness of a layer depends on the stress and the layer growth process conditions (e.g. temperature, growth rate, etc.)

Referring again to FIG. 4, the growth rate of a strained oxide layer is illustrated. A single crystal silicon substrate 42 is provided. Single crystal substrates, as explained above, are not limited to any specific crystal orientation but could include (111) silicon, (110) silicon, (100) silicon, offcuts thereof, or any other orientation or variation known and used in the art. A first rare earth oxide (REO I) layer 44 is epitaxially grown on substrate 42 so as to be a relaxed oxide layer with a thickness of >50 nm. It should be understood that layer 44 can be a single layer or it can be a multilayered relaxed REO template.

Figure 6:
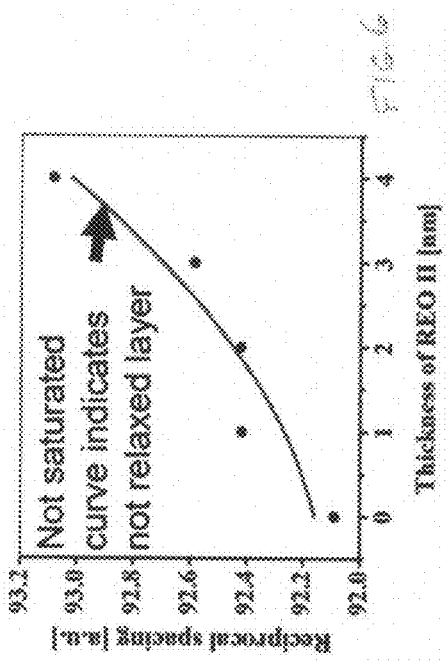
FIG. 6 is a graph illustrating the thickness of the REO II layer of FIG. 4 versus the reciprocal spacing.
Figure 5:
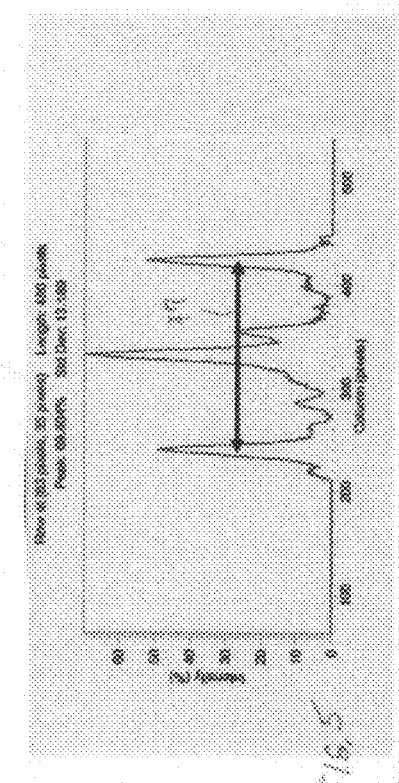
FIG. 5 is a RHEED maxima curve in reciprocal space illustrating stress in the REO II layer of FIG. 4.

Next, a second rare earth oxide (REO II) layer 46 is epitaxially grown on layer 44. REO II layer 46 is a strained oxide layer with a lattice constant different from the lattice constant of REO I 44. As explained above, a typical example of rare earth oxides with different lattice constants is Erbium oxide ($Er_2O_3$) grown on gadolinium oxide ($Gd_2O_3$), which is under tensile stress. The thickness of REO II layer 46 must be below 10 nm in order to maintain stress in its crystal structure. The stress in REO II layer 46 is evaluated by the change of its lattice constant indicated by distance of the RHEED (reflecting high energy electron diffraction) maxima in reciprocal space as illustrated in FIG. 5. The distance between maxima is designated with arrow 47. A higher distance between the maxima corresponds to smaller lattice constant in real space. The relationship between the thickness of REO II layer 46 and reciprocal spacing is illustrated in the graph of FIG. 6, with a not saturated curve indicating a not relaxed layer.

Referring additionally to FIG. 7, stressed REO II layer 46 is nitridized or modified with an N-plasma. The nitridized modification of REO II layer 46 is illustrated in FIG. 7 as REON II, designated 46' to indicate the modification. As explained above, because REO II layer 46 is stressed the nitridization is easier as compared to a relaxed REO layer.

A layer 48 of III-N semiconductor material can be epitaxially grown directly on REON II layer 46'. The crystal structure of REON II layer 46' is close enough to the crystal structure of III-N semiconductor material, such as GaN, so that a relatively thick layer can be grown with a tolerable amount of stress. Referring additionally to FIG. 9, an XRD-scan is illustrated of the structure illustrated in FIG. 8. The X-ray diffraction 2Θ-ω scan is of the FWHM structure of the GaN (0002) peak: 0.46 degree.

Turning now to FIG. 10, a simplified layer diagram is illustrated of a modification to the structure illustrated in FIG. 8, in accordance with the present invention. In this modification, a rare earth nitride (REN) and rare earth III nitride (RE-III-N) layer 49 is epitaxially grown on the nitridized REON II layer 46' and forms a nucleation-buffer layer which subsequently serves as a substrate for the epitaxial growth of III-N layer 48, such as GaN semiconductor material. It should be understood that the low temperature GaN followed by the bulk epitaxial layer of GaN structure illustrated and described in conjunction with FIG. 1 can also be incorporated into the present structure, or the Structure of FIG. 8, if desired.

Thus, new and improved methods for the growth of single crystal semiconducting III-N and, optionally, subsequent III-N material and new and improved structures grown on a silicon substrate are disclosed. The new and improved methods for the III-N material include specifically the nitrogen termination of the surface of a REO buffer using nitrogen plasma. Further, it has been found that the nucleation process can be more easily and quickly performed in stressed rare earth oxide layers. The subsequent epitaxial growth of a layer of low temperature GaN aids in the subsequent growth of a bulk III-N semiconducting material.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of growing III-N semiconducting material on a silicon substrate comprising the steps of:
providing a single crystal silicon substrate;
growing a layer of epitaxial rare earth oxide on the silicon substrate, the layer of epitaxial rare earth oxide having a surface;
terminating the surface of the layer of epitaxial rare earth oxide with nitrogen forming a nitrogen atom template;
growing a layer of III-N material on the nitrogen terminated surface of the layer of epitaxial rare earth oxide; and
growing a layer of bulk epitaxial III-N semiconductive material on the layer of III-N material.

2. The method as claimed in claim 1 wherein the step of growing the layer of III-N material includes epitaxially growing one of GaN and AlN.

3. The method as claimed in claim 1 wherein the step of terminating the surface of the layer of epitaxial rare earth oxide with nitrogen includes modifying the surface with nitrogen plasma.

4. The method as claimed in claim 3 wherein the step of modifying the surface of the layer of epitaxial rare earth oxide with the nitrogen plasma includes using the following parameters: the nitrogen plasma has an atomic-to-molecular ratio in a range of 2 to 4 and the substrate temperature during the nitrogen plasma modification is in a range of 550° C. to 850° C.

5. The method as claimed in claim 1 wherein the step of growing the layer of bulk epitaxial III-N semiconductive material includes using the parameters: a substrate temperature in a range of 800° C. to 950° C.; a gallium vapor partial pressure of approximately $2.5 \times 10^{-6}$ Torr; and an atomic-to-molecular nitrogen ratio in the plasma in a range of 2 to 4.

6. The method as claimed in claim 1 wherein the step of growing the layer of epitaxial rare earth oxide on the silicon substrate includes growing one of a single layer and a multilayer REO buffer.

7. The method as claimed in claim 1 wherein the step of growing the layer of epitaxial rare earth oxide on the silicon substrate includes epitaxially growing a first rare earth oxide layer substantially lattice matched to the silicon substrate and epitaxially growing a second rare earth oxide layer with a different lattice constant on the first rare earth oxide layer so that the second rare earth oxide layer is stressed.

8. The method as claimed in claim 7 wherein the step of epitaxially growing the second rare earth oxide layer includes growing the second rare earth oxide layer with a thickness below 10 nm to maintain stress in the crystal structure.

9. The method as claimed in claim 1 wherein the step of growing the layer of epitaxial III-N semiconducting material includes growing low temperature epitaxial bulk gallium nitride.

10. The method as claimed in claim 9 wherein the step of growing the layer of low temperature epitaxial gallium nitride includes using the parameters: a substrate temperature in a range of 450° C. to 650° C.; atomic-to-molecular nitrogen ratio in the plasma in a range of 2 to 4; and gallium vapor partial pressure of approximately $1 \times 10^{-6}$ Torr.

11. A method of growing III-N semiconducting material on a silicon substrate comprising the steps of:
providing a single crystal silicon substrate;
epitaxially growing a first layer of rare earth oxide on the silicon substrate, the first layer of rare earth oxide being substantially lattice matched to the silicon substrate;
epitaxially growing a second layer of rare earth oxide on the first layer of rare earth oxide, the second layer of rare earth oxide having a different lattice constant then the first layer of rare earth oxide creating a stress in the second layer of rare earth oxide;
nitridizing the second layer of epitaxial rare earth oxide with nitrogen to form a nucleation layer; and epitaxially growing a layer of III-N material on the nucleation layer of epitaxial rare earth oxide.

12. The method as claimed in claim 11 wherein the step of epitaxially growing the second layer of rare earth oxide includes growing the second layer of rare earth oxide with a thickness below 10 nm.

13. The method as claimed in claim 11 wherein the step of epitaxially growing the first layer of rare earth oxide includes growing the first layer of rare earth oxide with a thickness above 50 nm.

14. The method as claimed in claim 11 wherein the step of epitaxially growing the first layer of rare earth oxide on the silicon substrate includes growing one of a single layer and a multilayer REO buffer.

15. A method of growing III-N semiconducting material on a silicon substrate comprising the steps of:
providing a single crystal silicon substrate;
growing a layer of epitaxial rare earth oxide on the silicon substrate, the layer of epitaxial rare earth oxide having a surface;
modifying the surface of the layer of epitaxial rare earth oxide with a nitrogen plasma using the following parameters: the nitrogen plasma has an atomic-to-molecular ratio in a range of 2 to 4 and the substrate temperature during the nitrogen plasma modification is in a range of 550° C. to 850° C.;
growing a layer of low temperature epitaxial gallium nitride on the modified surface of the layer of epitaxial rare earth oxide using the parameters: a substrate temperature in a range of 450° C. to 650° C.; atomic-to-molecular nitrogen ratio in the plasma in a range of 2 to 4; and gallium vapor partial pressure of approximately $1 \times 10^{-6}$ Torr; and
growing a layer of bulk epitaxial III-N semiconductive material on the layer of low temperature epitaxial gallium nitride using the parameters: a substrate temperature in a range of 800° C. to 950° C.; a gallium vapor partial pressure of approximately $2.5 \times 10^{-6}$ Torr; and an atomic-to-molecular nitrogen ratio in the plasma in a range of 2 to 4.

* * * * *